United States Patent
Lin et al.

(10) Patent No.: US 8,445,995 B2
(45) Date of Patent: May 21, 2013

(54) SEMICONDUCTOR STRUCTURE WITH CONDUCTIVE PLUG IN AN OXIDE LAYER

(75) Inventors: Cha-Hsin Lin, Tainan (TW); Tzu-Kun Ku, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/117,172

(22) Filed: May 27, 2011

(65) Prior Publication Data

US 2012/0139105 A1 Jun. 7, 2012

(30) Foreign Application Priority Data

Dec. 6, 2010 (TW) .............................. 99142392 A

(51) Int. Cl.
*H01L 29/06* (2006.01)
*H01L 21/00* (2006.01)

(52) U.S. Cl.
USPC ........... 257/622; 257/700; 257/760; 257/774; 257/E23.019; 257/E23.167; 438/125; 438/622; 438/629

(58) Field of Classification Search
None
See application file for complete search history.

(56) References Cited

U.S. PATENT DOCUMENTS

| | | |
|---|---|---|
| 7,087,497 B2 | 8/2006 | Yuan et al. |
| 7,190,078 B2 | 3/2007 | Khandekar et al. |
| 7,196,263 B2 | 3/2007 | Fraas et al. |
| 7,642,171 B2 | 1/2010 | Ingle et al. |
| 7,690,109 B2 * | 4/2010 | Mori et al. ..................... 29/852 |
| 7,759,785 B2 | 7/2010 | Corisis et al. |
| 8,207,453 B2 * | 6/2012 | Ma et al. ..................... 174/262 |
| 8,309,402 B2 * | 11/2012 | Lin et al. ..................... 438/125 |
| 2002/0068434 A1 * | 6/2002 | Klein ..................... 438/633 |

FOREIGN PATENT DOCUMENTS

TW 200832666 8/2008

OTHER PUBLICATIONS

Topper et al., "3-D Thin Film Interposer Based on TGV (Through Glass Vias): An Alternative to Si-Interposer", Electronic Components and Technology Conference, May 31, 2010, p. 66-p. 73.
Civale et al., "Spin-on Dielectric Liner TSV for 3D Wafer Level Packaging Applications", International Interconnect Technology Conference, Jun. 6-9, 2010, p. 1-p. 3.
Sridharan et al, "Design and Fabrication of Bandpass Filters in Glass Interposer with Through-Package-Vias (TPV)", Electronic Components and Technology Conference, May 31, 2010, p. 530-535.
Sukumaran et al., "Through-Package-Via Formation and Metallization of Glass Interposers", Electronic Components and Technology Conference, May 31, 2010, p. 557-p. 563.

* cited by examiner

*Primary Examiner* — Alonzo Chambliss
(74) *Attorney, Agent, or Firm* — Jianq Chyun IP Office

(57) ABSTRACT

A manufacturing method of a semiconductor structure includes providing a substrate having an upper surface and a bottom surface. First openings are formed in the substrate. An oxidization process is performed to oxidize the substrate having the first openings therein to form an oxide-containing material layer, and the oxide-containing material layer has second openings therein. A conductive material is filled into the second openings to form conductive plugs. A first device layer is formed a first surface of the oxide-containing material layer, and is partially or fully electrically connected to the conductive plugs. A second device layer is formed on a second surface of the oxide-containing material layer, and is partially or fully electrically connected to the conductive plugs.

5 Claims, 9 Drawing Sheets

SEMICONDUCTOR STRUCTURE WITH CONDUCTIVE PLUG IN AN OXIDE LAYER

CROSS-REFERENCE TO RELATED APPLICATION

This application claims the priority benefit of Taiwan application serial no. 99142392, filed Dec. 6, 2010. The entirety of the above-mentioned patent application is hereby incorporated by reference herein and made a part of this specification.

TECHNICAL FIELD

The disclosure relates to a semiconductor structure and a manufacturing method thereof, in particular, to a semiconductor structure and a manufacturing method thereof applicable to the chip stack technology.

BACKGROUND

With the growing complexity of circuit design, the rapid development of the semiconductor process, and the increasing demands of circuit efficiency, the current integrated circuit is developed to a three-dimensional (3D) circuit connection mode, through which the wire length is decreased, the resistance-capacitance (RC) delay is reduced, and the circuit efficiency is improved. At present, as for the structure connecting the wafers or chips, a through silicon via (TSV) is usually used for vertical conduction between the chips or the wafers.

Generally, the manufacturing process of the TSV is as follows: a plurality of conductive plugs is formed in a wafer, and then the conductive plugs are enabled to penetrate the whole wafer through a thinning process at the back side of the wafer. However, the TSV structure formed in a silicon substrate may easily cause the problem of current leakage or signal missing during high-frequency signal transmission. At present, it is proposed to form the above conductive plugs in a glass substrate, so as to solve the problem that the current leakage or the signal missing may easily occur during the high-frequency signal transmission in the silicon substrate. However, as for the method of forming a through hole in the glass substrate, laser drilling or machinery drilling is mainly used. The process of the laser drilling or the machinery drilling not only has high complexity, but also has difficulty in manufacturing small-pitch through holes.

SUMMARY

A manufacturing method of a semiconductor structure is provided, which includes the following steps. A substrate having an upper surface and a bottom surface is provided. A plurality of first openings are formed in the substrate. An oxidization process is performed so as to oxidize the substrate having the first openings therein to form an oxide-containing material layer, and the oxide-containing material layer has a plurality of second openings therein. A conductive material is filled into the second openings to form a plurality of conductive plugs. A first device layer is formed on a first surface of the oxide-containing material layer, and is partially or fully electrically connected to the conductive plugs. A second device layer is formed on a second surface of the oxide-containing material layer, and is partially or fully electrically connected to the conductive plugs.

A semiconductor structure is provided, which includes an oxide-containing material layer, a plurality of conductive plugs, a first device layer, and a second device layer. The oxide-containing material layer has a first surface and a second surface. The conductive plugs are located in the oxide-containing material layer and penetrate the oxide-containing material layer. The first device layer is located on the first surface of the oxide-containing material layer, and is partially or fully electrically connected to the conductive plugs. The second device layer is located on the second surface of the oxide-containing material layer, and is partially or fully electrically connected to the conductive plugs.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
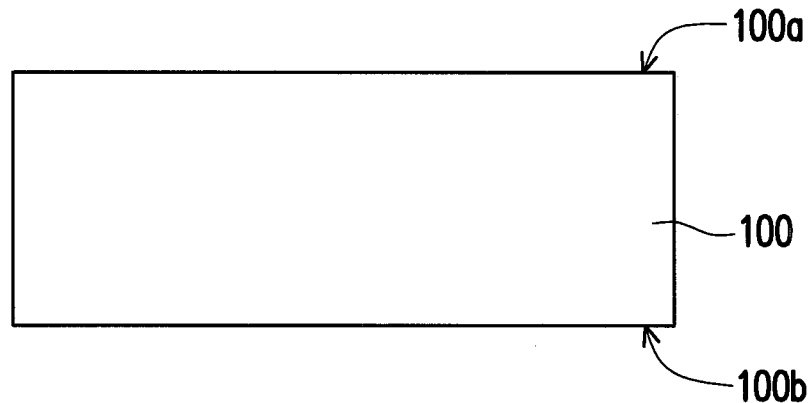
FIGS. 1A to 1G are schematic cross-sectional diagrams illustrating a manufacturing process of a semiconductor structure according to an exemplary embodiment.

FIGS. 1A to 1G are schematic cross-sectional diagrams illustrating a manufacturing process of a semiconductor structure according to an exemplary embodiment. Referring to FIG. 1A, a substrate 100 having an upper surface 100a and a bottom surface 100b is provided. According to an embodiment of the disclosure, the material of the substrate 100 includes silicon, and thus the substrate 100 may also be referred to as a silicon substrate. The substrate 100 may be a silicon wafer or a silicon chip.

Figure 1B:
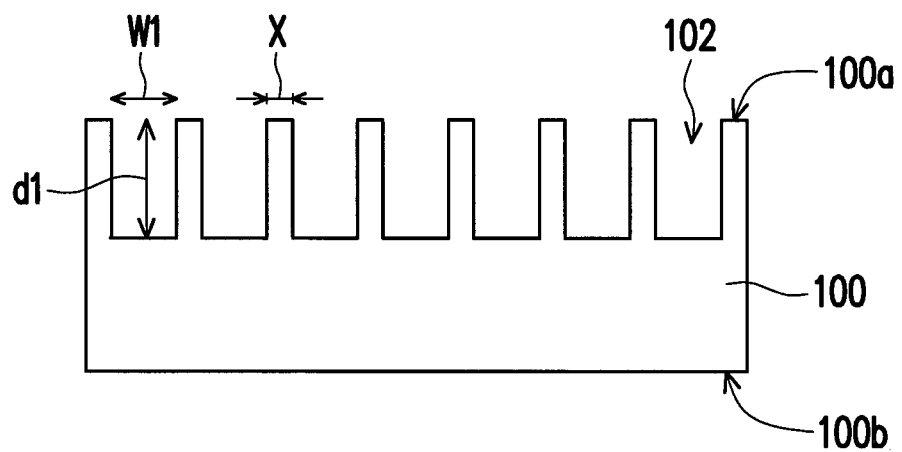

Referring to FIG. 1B, a plurality of first openings 102 are formed in the substrate 100. In the embodiment, the first openings 102 extend from the upper surface 100a of the substrate 100 toward the inside of the substrate 100. In another embodiment, the first openings 102 may also punch through the substrate 100 (not shown). According to this embodiment, as for the method of forming the first openings 102 in the substrate 100, a lithography process and an etching process may be adopted. Herein, the widths of the first openings 102 need to be large enough, so as to maintain the opening patterns after the subsequent oxidization process, and the depths of the first openings 102 are related to the lengths of the conductive plugs to be formed afterwards. Therefore, according to this embodiment, the widths W1 of the first openings 102 are between 0.001 µm and 1000 µm, and the depths d1 thereof are between 0.001 μm and 1000 μm. Preferably, the widths W1 of the first openings 102 are, for example, 15 μm, and the depths d1 thereof are, for example, 100 μm.

Figure 1C:
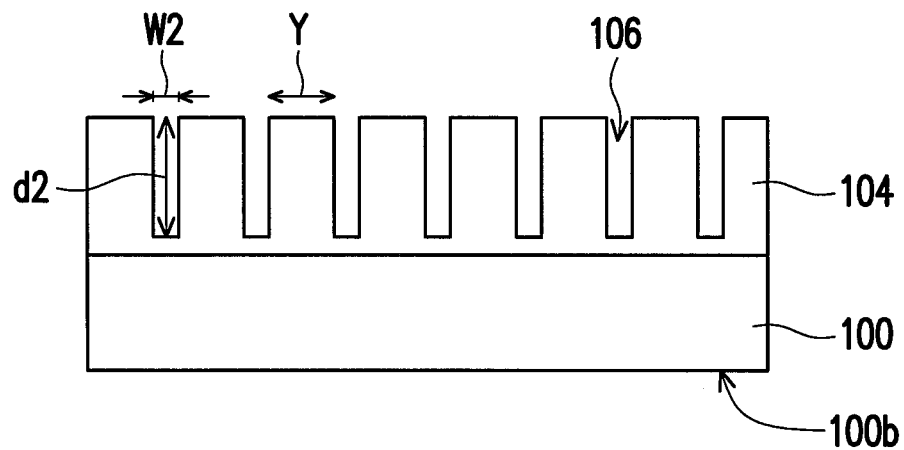
Figure 1D:
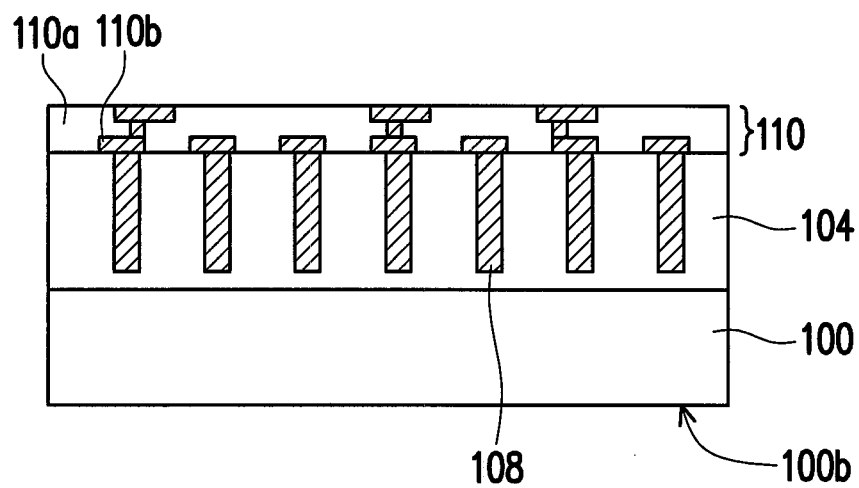

Then, an oxidization process is performed so as to partially oxidize the substrate 100 having the first openings 102 therein to form an oxide-containing material layer 104, and the oxide-containing material layer 104 has a plurality of second openings 106 therein, as shown in FIG. 1C. The oxide-containing material layer 104 is composed of an original material of the substrate 100 and an oxide material of the substrate 100. Alternatively, the oxide-containing material layer 104 is composed of an oxide material of the substrate 100. The oxidization process includes a thermal oxidization process, which may be a rapid thermal oxidation process or a furnace oxidation process. The temperature of the above thermal oxidization process is, for example, 1100° C.

It should be noted that, during the above thermal oxidization process, the fed oxygen gas reacts with the silicon atoms of the substrate 100 to form the oxide-containing material layer 104. Therefore, if the substrate 100 is a silicon substrate, the formed oxide-containing material layer 104 includes silicon dioxide. When the oxygen gas reacts with the silicon atoms of the substrate 100 to form the oxide-containing material layer 104, the silicon atoms of the substrate 100 are consumed at the same time during the process. Generally, the bulk of one mole of silicon is 12.06 cm$^3$, the bulk of one mole of silicon dioxide is 27.18 cm$^3$, and one mole of silicon may be converted into one mole of silicon dioxide. Therefore, the growing oxide-containing material layer 104 becomes 2.25 times the thickness of the original substrate 100 (27.18/12.06=2.25). In other words, if it is required to grow a thickness T of the oxide-containing material layer 104, 0.44 T of the thickness of the substrate 100 will be consumed.

In order to partially oxidize the substrate 100 between the first openings 102 to form the oxide-containing material layer 104, a special design is usually made to the distance between two adjacent first openings 102. Therefore, in this embodiment, if the distance between two adjacent first openings 102 is X (as shown in FIG. 1B), after the oxide-containing material layer 104 is formed, the distance between two adjacent second openings 106 is Y (as shown in FIG. 1C). The values of X and Y are further determined according to the growing of the oxide material and the consumption of the silicon atoms during the thermal oxidization process.

After the above thermal oxidization process, the dimensions of the second openings 106 in the oxide-containing material layer 104 are smaller than the dimensions of the first openings 102 in the original substrate 100. The widths W2 of the second openings 106 are between 0.001 μm and 1000 μm, and the depths d2 thereof are between 0.001 μm and 1000 μm.

Afterwards, referring to 1D, a conductive material is filled into the second openings 106 to form a plurality of conductive plugs 108. The material of the conductive material (the conductive plugs 108) includes a metal material, such as copper, tungsten, or other metals or alloys. In addition, a first device layer 110 is formed on the oxide-containing material layer 104, and is partially or fully electrically connected to the conductive plugs 108. According to this embodiment, the first device layer 110 includes a dielectric layer 110a and a conductive structure 110b. The first device layer 110 may include a metal wire layer, a resistance device layer, an inductance device layer, a capacitance device layer, a passive device layer, an active device layer or any combination thereof. For example, the first device layer 110 may be a wire layer without any devices thereon. The first device layer 110 may also a passive device layer with metal wires and passive devices thereon.

Figure 1E:
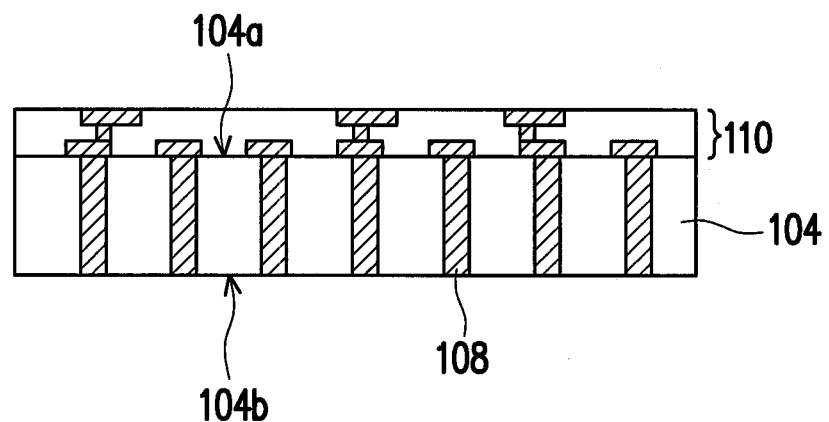

Then, a thinning process is performed on the bottom surface 100b of the substrate 100 until the conductive plugs 108 and the oxide-containing material layer 104 are exposed, as shown in FIG. 1E. The thinning process uses, for example, a grinding process or other suitable thinning processing methods. Specifically, the oxide-containing material layer 104 has a first surface 104a and a second surface 104b, and the above thinning process causes the second surface 104b of the oxide-containing material layer 104 to be exposed. In this embodiment, in order to ensure that all the conductive plugs 108 are exposed, an excessive thinning process (for example: chemical mechanical polishing process, CMP) may be adopted. In other words, even if the second surface 104b of the oxide-containing material layer 104 is already exposed through the thinning process of the substrate 100, the thinning process is still carried on until all the conductive plugs 108 are exposed. It is noted that if the openings 102 punch through the substrate 100 in the step of FIG. 1B, the thinning process can be omitted.

Figure 1F:
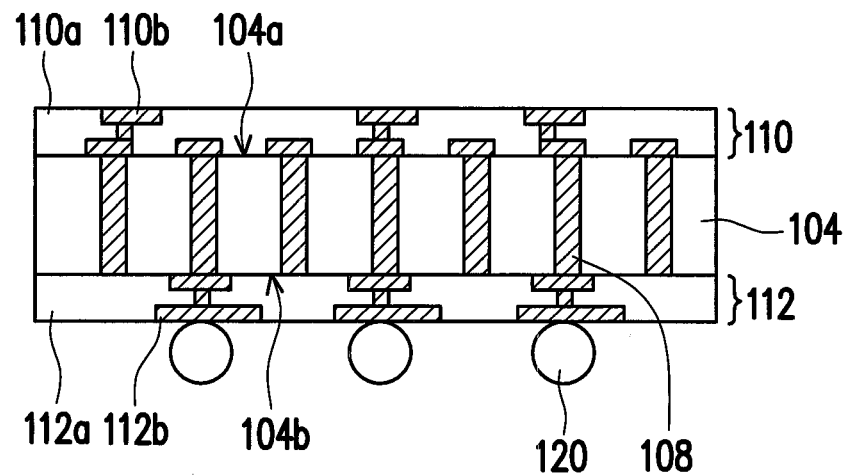

After the thinning process, as shown in FIG. 1F, a second device layer 112 is formed on the exposed second surface 104b of the oxide-containing material layer 104. The second device layer 112 is partially or fully electrically connected to the exposed conductive plugs 108. According to this embodiment, the second device layer 112 includes a dielectric layer 112a and a conductive structure 112b. The second device layer 112 may include a metal wire layer, a resistance device layer, an inductance device layer, a capacitance device layer, a passive device layer, an active device layer or any combination thereof. For example, the second device layer 112 may be a wire layer without active devices thereon. The second device layer 112 may also be a passive device layer with metal wires and passive devices thereon.

Based on the above description, in the structure shown in FIG. 1F, the conductive plugs 108 are disposed in the oxide-containing material layer 104, and thus the conductive plugs 108 may also be referred to as a through oxide via (TOV). In other words, since the conductive plugs 108 penetrate the oxide-containing material layer 104, the conductive plugs 108 are separated form each other through the oxide-containing material layer 104. Therefore, when the conductive plugs 108 are used for transmitting high-frequency signals, the problem of the current leakage or signal missing may be reduced due to the isolation effect of the oxide-containing material layer 104.

According to an embodiment of the disclosure, after forming the second device layer 112, a plurality of conductive bumps 120 are further formed on the second device layer 112, and are partially or fully electrically connected to the conductive structure 112b of the second device layer 112.

Afterwards, referring to FIG. 1G, a circuit board (or a chip) 150 is set below the second device layer 112, and the circuit board (or the chip) 150 is partially or fully electrically connected to the conductive bumps 120. According to an embodiment, if the circuit board 150 is set below the second device layer 112, the second device layer 112 is usually the line reconfiguration layer, so that the devices in the structure match with the lines of the circuit board 150 through the line reconfiguration layer 112. According to another embodiment, if the chip 150 is disposed below the second device layer 112, the second device layer 112 may be a metal wire layer, a resistance device, an inductance device, a capacitance device, or any combination thereof, and the second device layer 112 is partially or fully electrically connected to the chip 150 through the conductive bumps 120, so as to form a chip stack structure. In addition, a chip 160 may be further disposed above the first device layer 110, and the chip 160 is partially or fully electrically connected to the first device layer 110 through the conductive bumps 155.

According to an embodiment of the disclosure, if the chip 160 is disposed above the first device layer 110 and the chip 150 is disposed below the second device layer 112, this structure is a stack structure formed by three chips stacked over one another. In addition, if the chip 160 is disposed above the first device layer 110 and the circuit board 150 is disposed below the second device layer 112, this structure is a stack structure formed by two chips and a circuit board stacked over one another. However, the disclosure does not limit the number of the chips in FIG. 1G. That is to say, in other embodiments, more chips may be disposed above or below the first device layer 110 and/or the second device layer 112, so as to form a 3D chip stack structure.

Figure 2A:
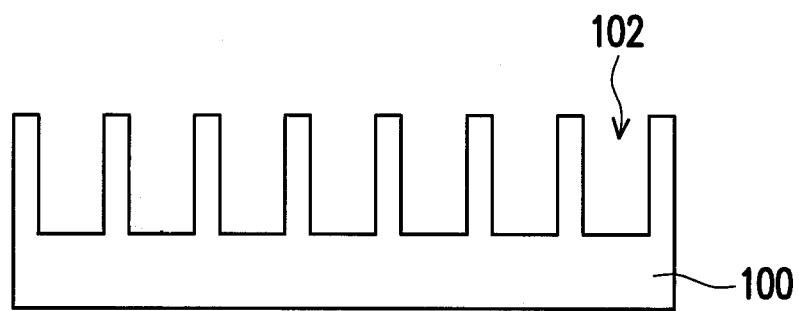
FIGS. 2A to 2D are schematic cross-sectional diagrams illustrating a manufacturing process of a semiconductor structure according to an exemplary embodiment.

It is noted that, in the embodiment of FIG. 1A to FIG. 1E, the oxidization process is performed to partially oxidize the substrate 100 (shown in FIG. 1C), and then the thinning process is performed on the bottom surface 100b of the substrate 100 to expose the conductive plugs 108 and the oxide-containing material layer 104 (shown in FIG. 1E). However, according to another embodiment, if the substrate 100 is thin enough or a special oxidization process is introduced, the oxidization process may completely oxidize the substrate 100 to form the oxide-containing material layer 104. As shown in FIG. 2A, a plurality of first openings 102 are formed in the substrate 100, and the substrate 100 is thinner. The first openings 102 may be formed with the same or similar process of FIG. 1B, and have the same or similar width, space and depth. In the embodiment, the first openings 102 are formed in the substrate 100 and do not pass through the substrate 100. According to another embodiment, the first openings 102 may also punch through the substrate 100 (not shown).

Figure 2B:
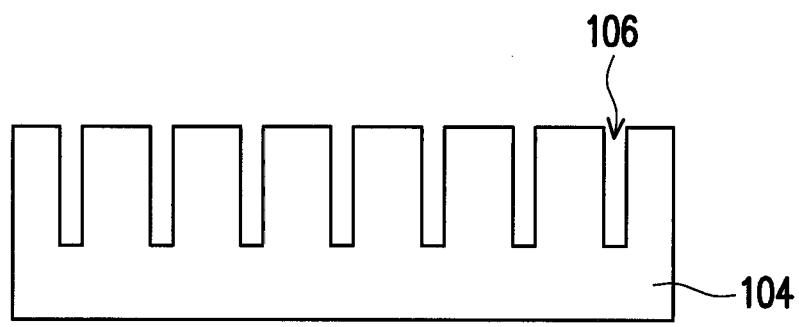

As shown in FIG. 2B, an oxidization process is performed to completely oxidize the substrate 100, and the oxide-containing material layer 104 has a plurality of second openings 106 therein. Similarly, the second openings 106 may have the same or similar width, space and depth.

Figure 2C:
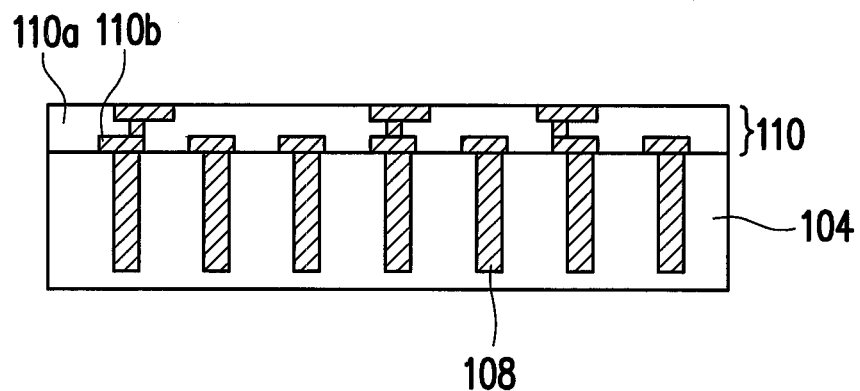

A conductive material is filled into the second openings 106 to form a plurality of conductive plugs 108 as shown in FIG. 2C. In addition, a first device layer 110 is formed on the oxide-containing material layer 104, and is partially or fully electrically connected to the conductive plugs 108.

Figure 1G:
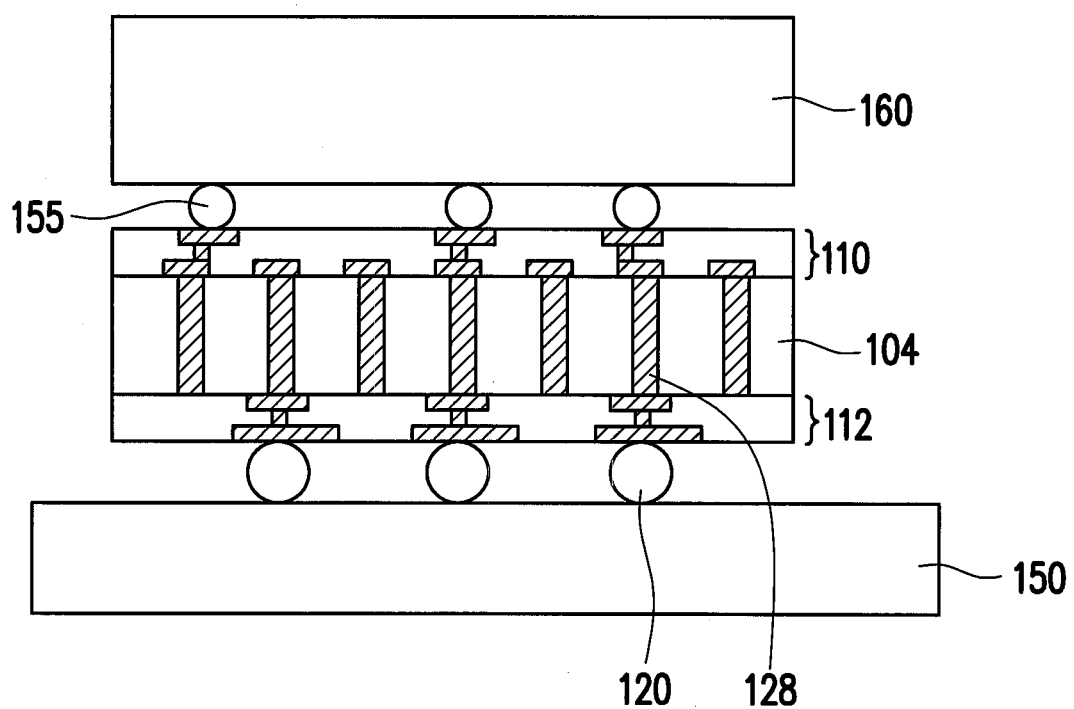
Figure 2D:
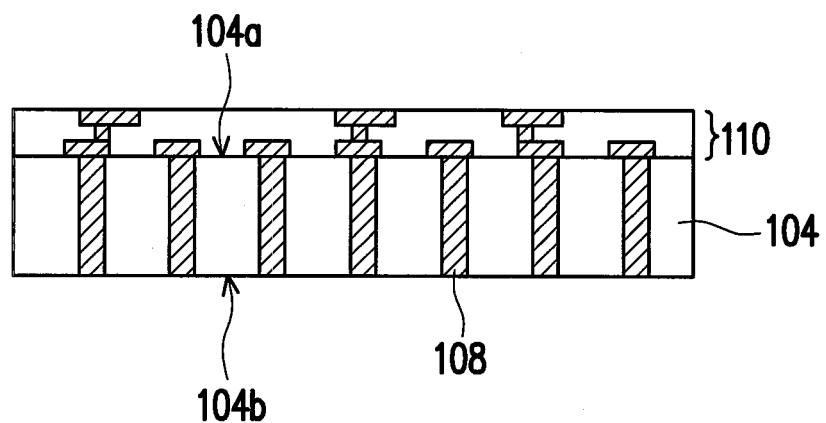

As shown in FIG. 2D, after forming the first device layer 110 on the surface 104a of the oxide-containing material layer 104, a thinning process is performed to the surface 104b of the oxide-containing material layer 104 until the conductive plugs 108 are exposed. It is noted that if the openings 102 punch through the substrate 100 in the step of FIG. 2A, the thinning process can be omitted. Thereafter, the steps as shown in FIG. 1F and FIG. 1G may also be performed on the structure of FIG. 2D so as to form a semiconductor structure or a 3D chip stack structure.

The semiconductor structure formed by the above method is as shown in FIG. 1F, which includes an oxide-containing material layer 104, a plurality of conductive plugs 108, a first device layer 110, and a second device layer 112.

The oxide-containing material layer 104 has a first surface 104a and a second surface 104b. According to an embodiment of the disclosure, the oxide-containing material layer 104 includes silicon dioxide.

The conductive plugs 108 are located in the oxide-containing material layer 104 and penetrate the oxide-containing material layer 104. The material of the conductive plugs 108 include copper, tungsten, or other metals or alloys.

The first device layer 110 is located on the first surface 104a of the oxide-containing material layer 104, and is partially or fully electrically connected to the conductive plugs 108. The first device layer 110 includes a dielectric layer 110a and a conductive structure 110b. The first device layer 110 may include a metal wire layer, a resistance device, an inductance device, a capacitance device, or any combination thereof.

The second device layer 112 is located on the second surface 104b of the oxide-containing material layer 104, and is partially or fully electrically connected to the conductive plugs 108. The second device layer 112 is partially or fully electrically connected to the exposed conductive plugs 108. According to this embodiment, the second device layer 112 includes the dielectric layer 112a and the conductive structure 112b. The second device layer 112 may include a metal wire layer, a line reconfiguration layer, a resistance device, an inductance device, a capacitance device, or any combination thereof.

According to an embodiment of the disclosure, the second device layer 112 further includes a plurality of conductive bumps 120, and the conductive bumps 120 are partially or fully electrically connected to the conductive structure 112b of the second device layer 112.

A semiconductor structure of another embodiment of the disclosure is as shown in FIG. 1G, which includes a chip 160 and a circuit board (or chip) 150 in addition to the structure shown in FIG. 1F.

In the above embodiment, the method of forming the conductive plugs 108 is as follows. The first openings 102 are formed in the substrate 100 first, and then the oxidization process is performed to oxidize the substrate 100 having the first openings 102 into the oxide-containing material layer 104. Afterwards, the conductive material is filled into the second openings 106 in the oxide-containing material layer 104. Through the above oxidization process, the substrate 100 having the first openings 102 (that is, the thickness of the substrate 100 at least equivalent to the depth of the first openings 102) can be oxidized into the oxide-containing material layer 104. In order to enable the substrate 100 to be partially oxidized into the oxide-containing material layer 104, another embodiment of the disclosure is provided in the following.

Figure 3A:
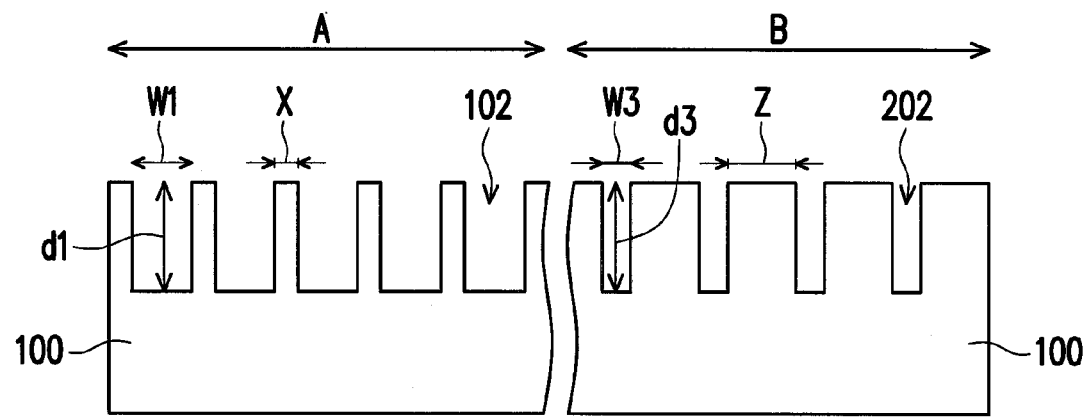
FIGS. 3A to 3B are schematic cross-sectional diagrams illustrating a manufacturing process of a semiconductor structure according to another exemplary embodiment.
Figure 3B:
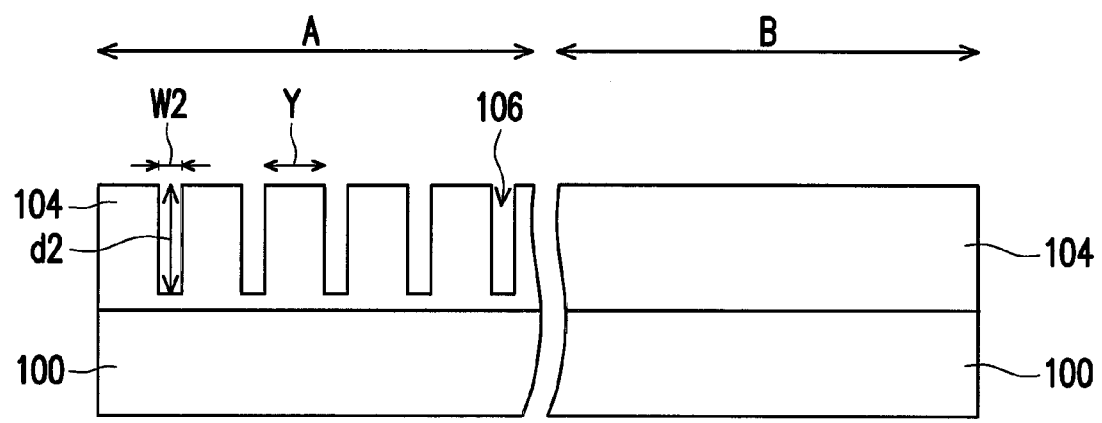

FIGS. 3A to 3B are schematic cross-sectional diagrams illustrating a manufacturing process of a semiconductor structure according to another exemplary embodiment. Referring to FIG. 3A, in this embodiment, a substrate 100 has a device area A and a blank area B. The device area A is equivalent to the area shown in FIGS. 1A to 1G, and the blank area B is an area with no device configured therein, or an area that does not need to form any conductive plug therein. In order to enable partial thickness of the substrate 100 of the blank area B to be oxidized into the oxide-containing material layer during the oxidization process, when the first openings 102 are formed in the substrate 100 of the device area A in this embodiment, a plurality of dummy openings 202 are further formed in the substrate 100 of the blank area B. According to this embodiment, the dimensions of the dummy openings 202 are smaller than the dimensions of the first openings 102. The widths W3 of the dummy openings 202 are between 0.001 μm and 1000 μm, and the depths d3 thereof are between 0.001 μm and 1000 μm.

Referring to FIG. 3B, an oxidization process is performed so as to partially oxidize the substrate 100 having the first openings 102 and the dummy openings 202 to form an oxide-containing material layer 104. The oxidization process is the same as or similar to the oxidization process of FIG. 1C, and will not be described herein again. After the oxidization process, a plurality of second openings 106 are formed in the oxide-containing material layer 104 of the device area A. Specifically, if the dimensions of the dummy openings 202 in the blank area B are smaller than the dimensions of the first openings 102 in the device area A, the dummy openings 202 located in the blank area B are filled up with the oxide-containing material layer 104 after the oxidization process. In other words, the second openings 106 are reserved in the oxide-containing material layer 104 of the device area A, but the blank area B has no opening pattern. According to another embodiment, if the dimensions of the dummy openings 202 in the blank area B are equal to the dimensions of the first openings 102 in the device area A, the dummy openings 202 in the blank area B are not completely filled up with the oxide-containing material layer 104 after the oxidization process.

Figure 4A:
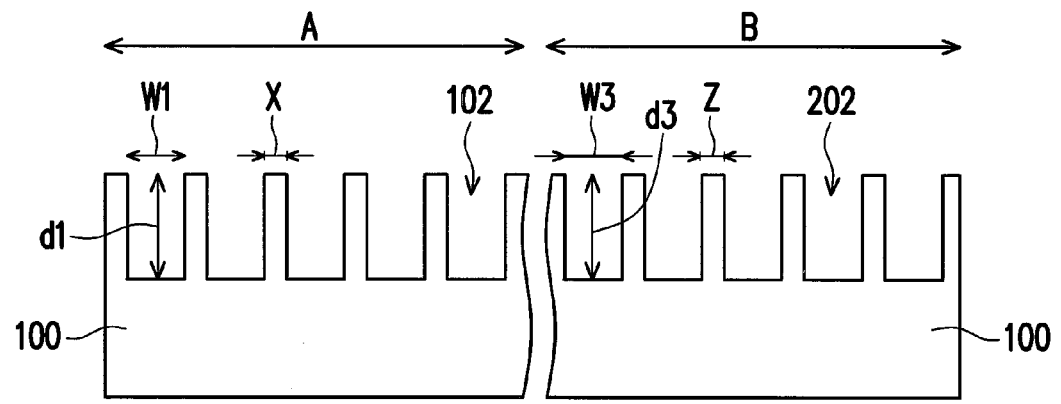
FIGS. 4A to 4B are schematic cross-sectional diagrams illustrating a manufacturing process of a semiconductor structure according to another exemplary embodiment.
Figure 4B:
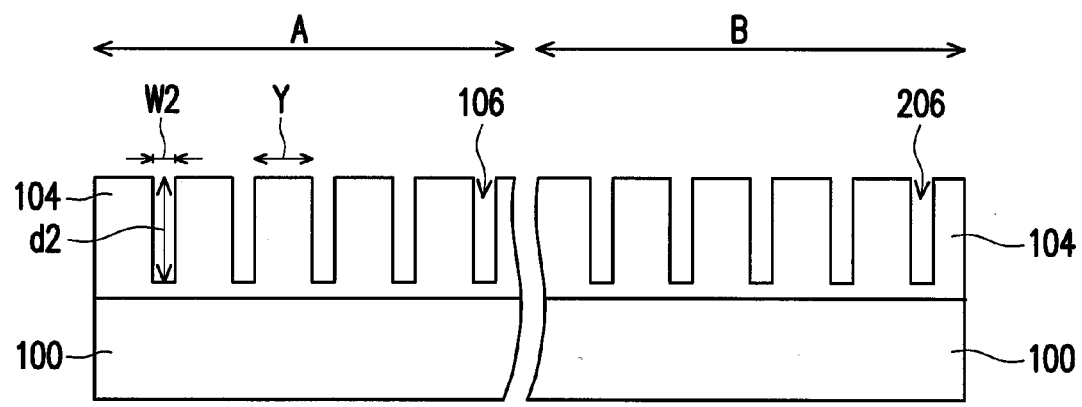

FIGS. 4A to 4B are schematic cross-sectional diagrams illustrating a manufacturing process of a semiconductor structure according to another exemplary embodiment. The embodiment is similar to FIG. 3A and FIG. 3B, and the elements in the embodiment similar or the same to FIG. 3A and FIG. 3B are not repeated again. In the embodiment, as shown in FIG. 4A, a plurality of first openings 102 are formed in the substrate 100 of the device area A, and a plurality of dummy openings 202 are formed in the substrate 100 of the blank area B. According to this embodiment, the dimensions of the dummy openings 202 are equal or not equal to the dimensions of the first openings 102. As shown in FIG. 4B, an oxidization process is performed so as to partially oxidize the substrate 100 having the first openings 102 and the dummy openings 202 to form an oxide-containing material layer 104. After the oxidization process, the oxide-containing material layer 104 does not fill up the first openings 102 and a plurality of second openings 106 are formed in the oxide-containing material layer 104 of the device area A. Similarly, the oxide-containing material layer 104 does not fill up the dummy openings 202 and dummy openings 206 are formed in the oxide-containing material layer 104 of the blank area B.

It is noted that, in the embodiment of FIG. 4B, an additional deposition process is further performed to form an insulating material (not shown) on the oxide-containing material layer 104.

Based on the above description, in order to enable the oxide-containing material layer 104 of the device area A to have a plurality of second openings 106 after the oxidization process, and to enable the dummy openings 202 located in the blank area B to be filled up with the oxide-containing material layer 104, a special design is usually made to the distance X between two adjacent first openings 102 and to the distance Z between two adjacent dummy openings. The values of X and Z are further determined according to the growing of the oxide material and the consumption of the silicon atoms during the thermal oxidization process. In addition, the thickness of the growing oxidization layer is generally used as an upper limit value for X and Z.

Afterwards, the steps from FIG. 1D to FIG. 1G may be performed, so as to form a semiconductor structure or a 3D chip stack structure.

FIG. 4 is a simulation curve diagram illustrating frequency and resistance of a TOV exemplary embodiment and a TSV comparison embodiment. It can be known from FIG. 4 that, through the structure of separating the adjacent conductive plugs with silicon dioxide, the variation of the resistance value thereof is low in operation at different frequencies. On the contrary, through the structure of separating the adjacent conductive plugs with silicon, the variation of the resistance value thereof is high in operation at different frequencies. Therefore, the TOV structure provided in the disclosure is more applicable to high-frequency operation in comparison with the conventional structure.

Figure 5:
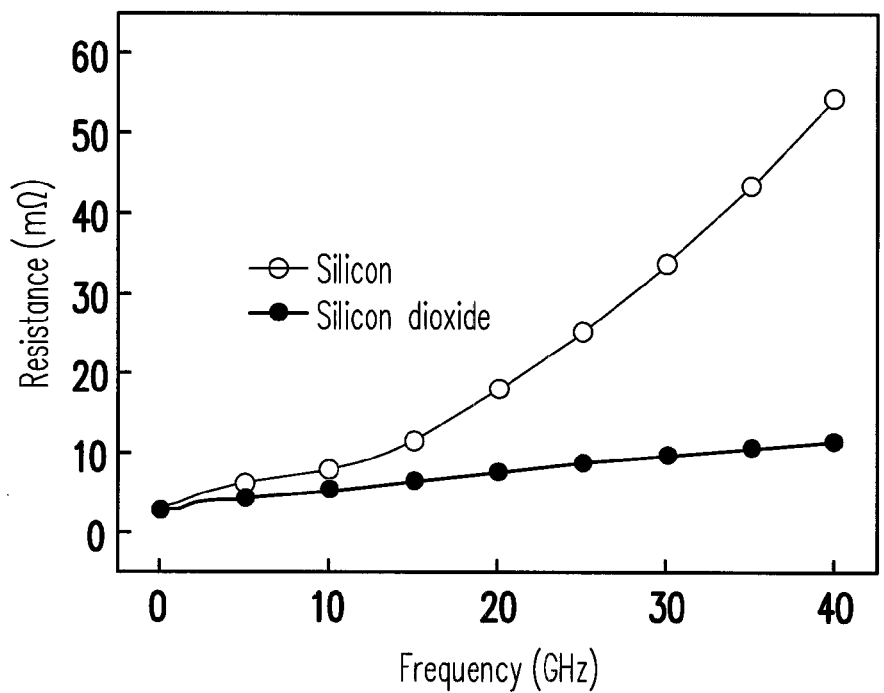
FIG. 5 is a simulation curve diagram illustrating frequency and resistance of an exemplary embodiment and a comparison example.
Figure 6:
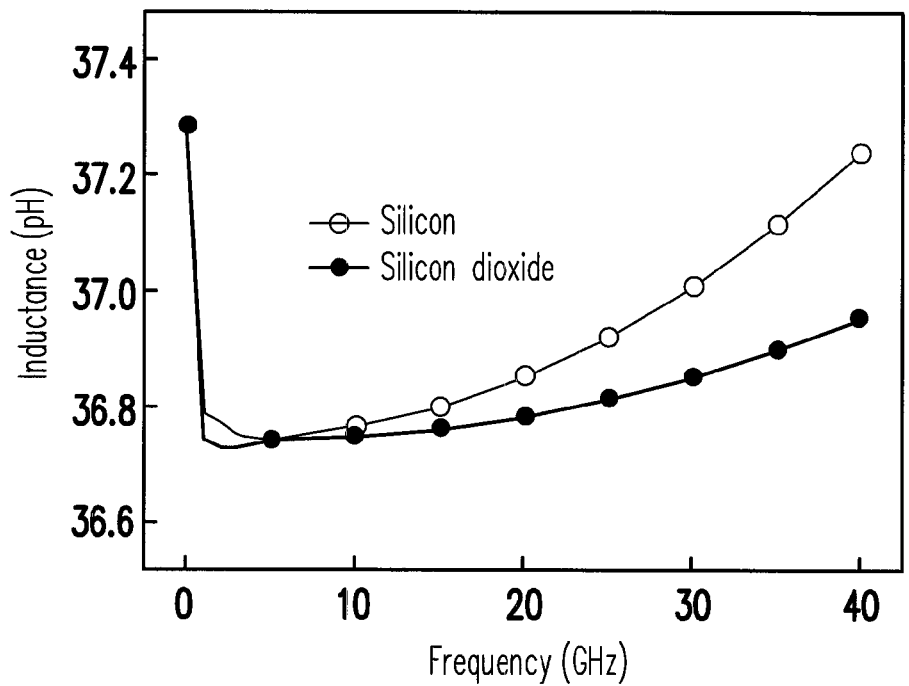
FIG. 6 is a simulation curve diagram illustrating frequency and inductance of an exemplary embodiment and a comparison example.

FIG. 5 is a simulation curve diagram illustrating frequency and inductance of a TOV exemplary embodiment and a TSV comparison embodiment. It can be known from FIG. 5 that, through the semiconductor structure of separating the adjacent conductive plugs with silicon dioxide, the variation of the inductance value thereof is low in operation at different frequencies. On the contrary, through the semiconductor structure of separating the adjacent conductive plugs with silicon, the variation of the inductance value thereof is high in operation at different frequencies. Therefore, the TOV structure provided in the disclosure is more applicable to high-frequency operation in comparison with the conventional structure.

Based on the above description, since the oxidization process is performed to partially oxidize the substrate having the first openings therein to form the oxide-containing material layer, the second openings are completely located in the oxide-containing material layer. Therefore, after the conductive material is filled into the second openings to form the conductive plugs, the conductive plugs are separated by the oxide-containing material layer. Through this structure, the problem of the current leakage or signal missing during the high-frequency signal transmission may be reduced in comparison with the conventional TSV structure.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A semiconductor structure, comprising:
   an oxide-containing material layer, comprising a first surface and a second surface, wherein a material of the oxide-containing material layer is an oxide of a silicon substrate;
   a plurality of conductive plugs, located in the oxide-containing material layer, and penetrating the oxide-containing material layer, wherein a thickness of the oxide-containing material layer and a height of the conductive plugs are substantially equal;
   a first device layer, located on the first surface of the oxide-containing material layer, and partially or fully electrically connected to the conductive plugs; and
   a second device layer, located on the second surface of the oxide-containing material layer, and partially or fully electrically connected to the conductive plugs.

2. The semiconductor structure according to claim 1, wherein the oxide-containing material layer comprises silicon dioxide.

3. The semiconductor structure according to claim 1, further comprising a plurality of conductive bumps, located on the second device layer.

4. The semiconductor structure according to claim 1, further comprising a circuit board or at least one chip, located below the second device layer, and partially or fully electrically connected to the conductive bumps.

5. The semiconductor structure according to claim 1, further comprising at least one chip, located on the first device layer, and partially or fully electrically connected to the first device layer.

* * * * *